(12) United States Patent
El-Ghobashy et al.

(10) Patent No.: US 6,388,880 B1
(45) Date of Patent: May 14, 2002

(54) REMOVABLE FAN TRAY ASSEMBLY WITH LATCHING FEATURES

(75) Inventors: Noha El-Ghobashy, Ft. Lee; Albert Pedoeem, West Orange, both of NJ (US); Jana Regenwetter, Canton, MA (US)

(73) Assignee: Fijitsu Network Communications, Inc., Richardson, TX (US)

( * ) Notice: Subject to any disclaimer, the term of this patent is extended or adjusted under 35 U.S.C. 154(b) by 26 days.

(21) Appl. No.: 09/692,537

(22) Filed: Oct. 19, 2000

(51) Int. Cl.[7] ................................................. H05K 7/20
(52) U.S. Cl. ...................... 361/695; 361/690; 361/694; 174/16.1; 165/104.33; 165/122
(58) Field of Search .............................. 361/679, 683, 361/689–695; 174/15.1, 16.1; 165/80.2, 80.3, 104.33, 185; 454/184

(56) References Cited

U.S. PATENT DOCUMENTS

| | | | |
|---|---|---|---|
| 3,967,874 A | | 7/1976 | Calabro .................. 339/112 R |
| 4,399,485 A | | 8/1983 | Wright et al. ................ 361/383 |
| 4,860,163 A | | 8/1989 | Sarath ........................ 361/384 |
| 4,894,749 A | | 1/1990 | Elko et al. .................. 361/383 |
| 5,210,680 A | | 5/1993 | Scheibler .................... 361/384 |
| 5,375,038 A | | 12/1994 | Hardt ......................... 361/694 |
| 5,563,768 A | | 10/1996 | Perdue ....................... 361/695 |
| 5,862,037 A | * | 1/1999 | Behl ........................... 361/687 |
| 5,914,858 A | | 6/1999 | McKeen et al. ............ 361/695 |
| 5,991,157 A | * | 11/1999 | Kim et al. .................. 361/719 |
| 5,999,403 A | * | 12/1999 | Neustadt ...................... 61/695 |
| 6,071,082 A | * | 6/2000 | Lecinski et al. ............. 417/53 |
| 6,081,419 A | * | 6/2000 | Pham ......................... 361/617 |
| 6,115,250 A | * | 9/2000 | Schmitt ...................... 361/695 |
| 6,272,013 B2 | * | 8/2001 | Negishi ...................... 361/695 |
| 6,310,770 B1 | * | 10/2001 | Negishi ...................... 361/695 |
| 6,317,320 B1 | * | 11/2001 | Cosley et al. ............... 361/695 |

OTHER PUBLICATIONS

Engineering drawings of chassis and fan tray for Flash 150 product in public use more than one year before Oct. 19, 2000.

* cited by examiner

Primary Examiner—Leo P. Picard
Assistant Examiner—Boris L. Chervinsky
(74) Attorney, Agent, or Firm—Weingarten, Schurgin, Gagnebin & Lebovici LLP

(57) ABSTRACT

A fan tray assembly is adapted to be attached to an electronics enclosure. It draws in air from below and pushes the air upward toward the enclosure. The fan tray cools electronics in a card cage portion of the electronics enclosure that includes a backplane, the card cage, a plenum beneath the card cage and a card cage door. The fan tray has two sides, a front and a back, and a rectangular shape. The fan tray mounts under the plenum of the electronics enclosure by sliding into place. The fan tray bottom has apertures to allow entry of air and a plurality of fans disposed in an array, each fan positioned over an aperture. A filter is disposed beneath the tray and sized to filter air into all apertures. Power connector and signal connectors connect to cables transporting signals between the back plane and the fan tray and bring power to the fans. The fan tray cannot be slid from a home position when the power connector is engaged with a power connection. The front panel of the fan tray closes with slam locks.

11 Claims, 9 Drawing Sheets

REMOVABLE FAN TRAY ASSEMBLY WITH LATCHING FEATURES

CROSS REFERENCE TO RELATED APPLICATIONS

N/A

STATEMENT REGARDING FEDERALLY SPONSORED RESEARCH OR DEVELOPMENT

BACKGROUND OF THE INVENTION

The present invention relates generally to air cooling of electronic devices, and more specifically to forced air cooling of such devices by multiple fans mounted in a tray coupled to a chassis.

Cooling of electronic devices is typically accomplished by way of ambient or forced convection cooling. When forced convection cooling is used, a volume of air is directed past the electronic devices either by suction or by pressure. In the chassis for such devices, it is known to mount components on cards and to orient the cards parallel to the direction of air flow to enhance cooling.

When a single fan is used to supply the forced convection cooling, the electronic devices are liable to be damaged should the fan fail; or, if fan failure is detectable, the system may be subject to unscheduled shutdown to prevent such damage. In addition, as the volume of air required to cool the devices increases, the audible noise of a powerful fan moving larger volumes of air may preclude the system from being installed in an office or a residence.

When multiple fans are used, the failure of a single fan may not cause damage but reduces the volume of air being provided for cooling. A failed fan may degrade the performance of the fan system because the failed fan acts like an opening in the chassis allowing some of the forced air to escape without cooling the electronic devices.

It would therefore be desirable to have a fan tray for cooling electronic devices. Such a fan tray would be easily coupleable to a chassis, would provide sufficient air cooling to electronic devices even if one of a plurality of fans incorporated therein fails to operate, and would be relatively quiet during fan operation. It would also be desirable to have a fan tray that reduces air diversion from the cooling airflow and minimizes the need for blocking structures in the area to be cooled.

BRIEF SUMMARY OF THE INVENTION

In accordance with the present invention, a fan tray is provided that includes a number of fans laid out in an array to draw air through the tray. Such a tray is adapted to be incorporated in a variety of chassis where cooling of electronic devices is needed. In one aspect, the fan tray is mounted below an electronics enclosure drawing in ambient air. The fan tray incorporates interlocks that require that all power and signal connections to the fan tray be disconnected before the tray can be removed. The fan tray can operate with or without a filter installed beneath the fan tray. However, if the filter is installed, the filter cannot be removed without disconnecting power to the tray prior to removal.

An air dam separates a one rank of fans from another rank. The dam improves upward airflow and decreases air diversion should one fan fail. The air dam further creates a plenum allowing air pressure to build and laminar airflow to develop before entering the card cage. The plenum may be made more effective by extended its depth. While the increased depth may be accomplished by deepening the fan tray, it can also be accomplished by creating a plenum under the enclosure. When the fan tray is mounted beneath the enclosure, the two plenums may be aligned forming one extended plenum. A baffle in the enclosure plenum, aligned with the air dam, further improves the operation of the assembly. The plenum arrangement further allows increased airflow from operational fans to compensate for a failed fan.

Multiple fans supply the same airflow as one larger fan with the benefits of quieter and more reliable operation even if one of the fans fails.

BRIEF DESCRIPTION OF THE SEVERAL VIEWS OF THE DRAWING

The invention will be more fully understood with reference to the following Detailed Description of the Invention in conjunction with the drawings of which.

DETAILED DESCRIPTION OF THE INVENTION

Figure 1:
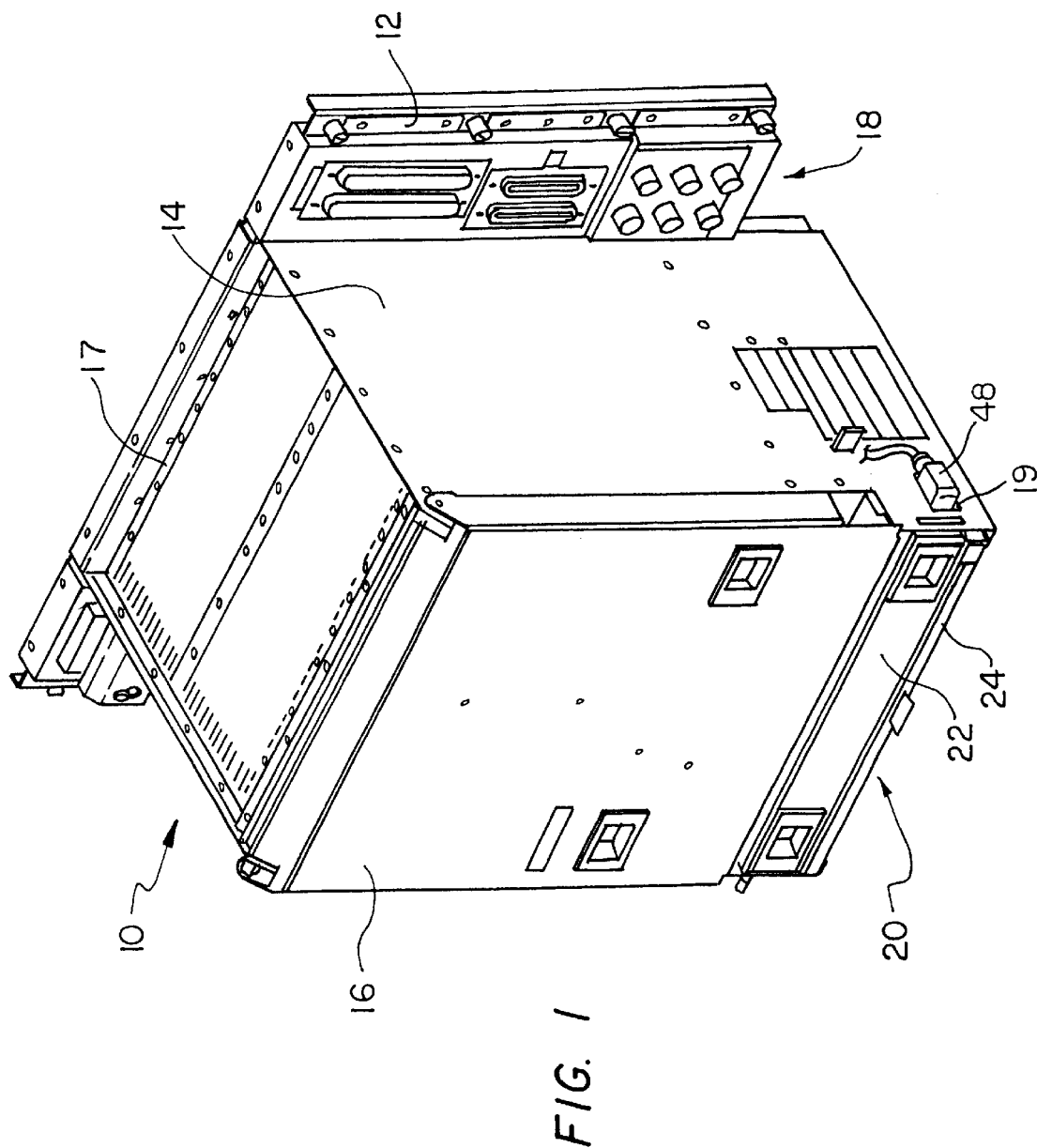
FIG. 1 is a perspective view of an enclosure and fan tray according to the present invention.

FIG. 1 is a perspective view of a fan tray 20 incorporated in an electronics enclosure or chassis 10 in accordance with the present invention. Enclosure 10 is representative of an electronics enclosure that can be used in a central office, a business or a residence. Enclosure 10 is generally box shaped and consists of a mounting panel 12, side panels 14, a front cover 16 that covers a portion of the enclosure 10 and an air permeable top panel 17. A backplane 18 (FIG. 2) may be suitably mounted to the mounting panel 12. Inside the enclosed portion of enclosure 10, electronic devices may be mounted such as in a card cage as is known in the art. In one aspect, the card cage is constructed to allow airflow only in a vertical direction. Fan tray 20 consists of a tray holding fans, power distribution and sensing logic (not shown), a front panel 22, a filter 24 beneath the tray, and connectors 26 and 36 (FIG. 5a) accessible through openings 19 in side panels 14. The illustrated enclosure may be adapted for rack or wall mounting or any other suitable mounting.

Figure 2:
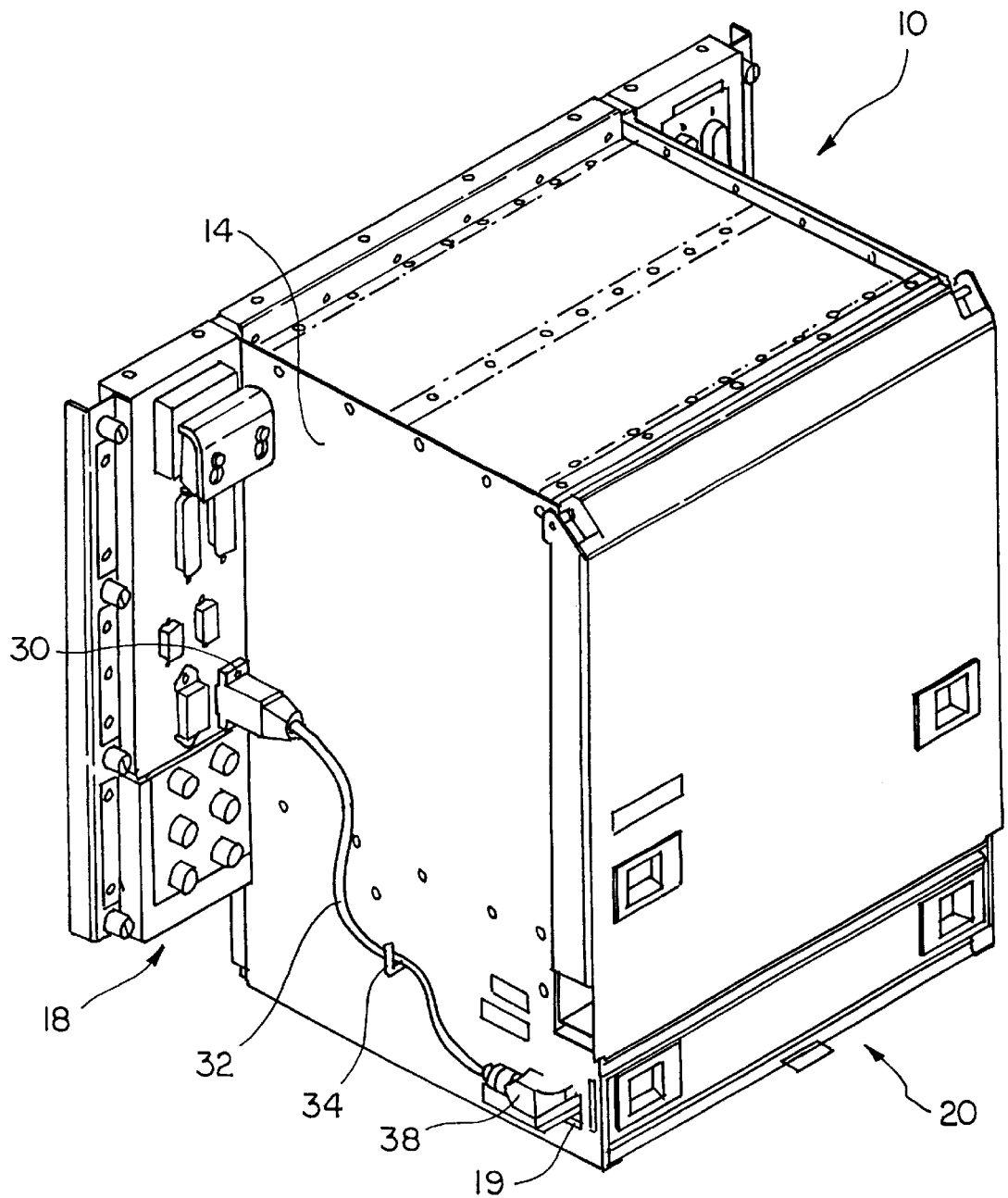
FIG. 2 is a second perspective view of an enclosure and fan tray according to the invention.

FIG. 2 is another perspective view of the enclosure 10 and fan tray 20 but from the opposite side from FIG. 1. FIG. 2 illustrates a signal cable 32 including a connector 30 coupled to the backplane 18 and a cable connector 38 passing through cutout 19 in the enclosure side panel 14 and coupled to fan tray 20. Signal cable 32 may be fed through cable tie down 34 for strain relief and cable management.

Figure 3:
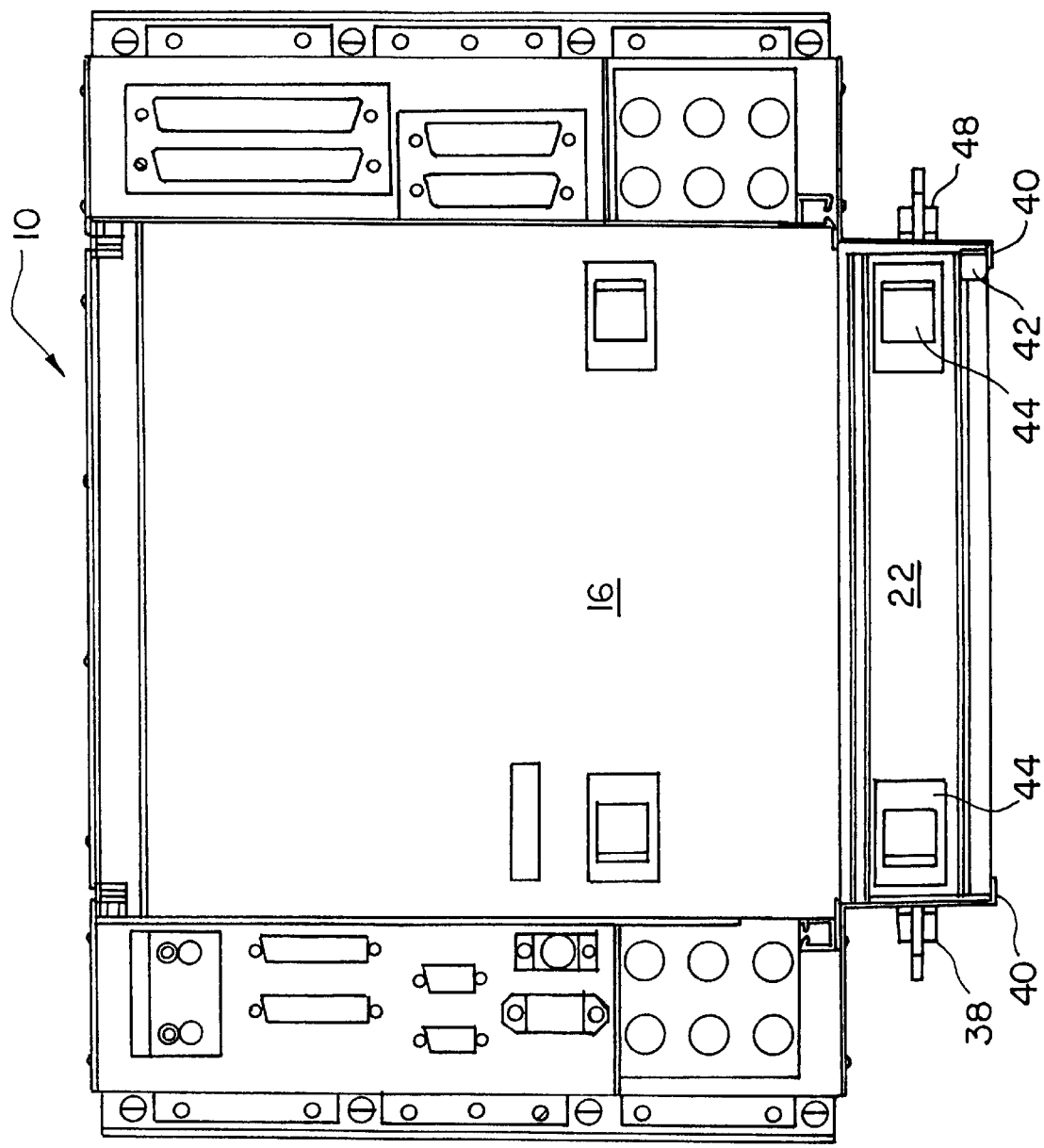
FIG. 3 is front view of an enclosure and fan tray according to the present invention.

FIG. 3 is a front view of the chassis 10 and fan tray 20. Channel 56 (FIG. 4) spans the chassis 10 at the bottom of the enclosed portion of the chassis. Chassis front cover 16 engages the upper leg of channel 56 to seal the front wall of the card cage. The fan tray 20 rests on flanges 40 of the chassis and slides into the space beneath the enclosed portion of the chassis. Fan tray front cover 16 engages the lower leg of channel 56 to assure that air does not leak out the front panel opening.

Figure 4:
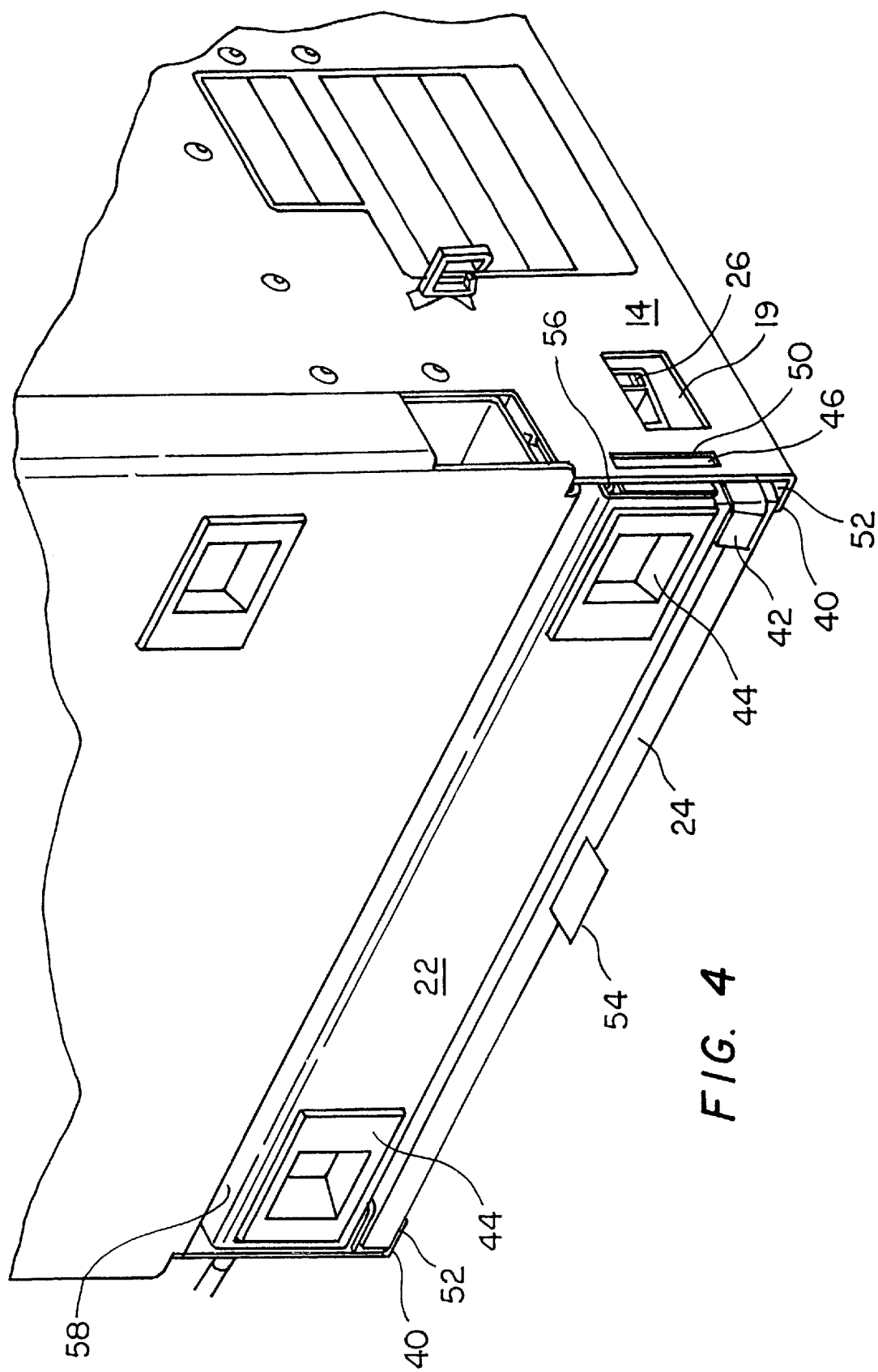
FIG. 4 is a perspective detail of an enclosure and fan tray showing the interlock of the present invention.

Slam latches 44 are mounted in front panel 22 and hold the fan tray 20 securely in the chassis 10 providing a gripping point for withdrawing the fan tray 20 from its position in the chassis. As shown in FIG. 4, tongues 46 of the slam latches 44 engage cutouts 50 in the side panels 14 to hold the fan tray 20 in place. Slam latches 44 can be displaced toward the center of the fan tray 20, withdrawing the tongues 46 from the cutouts 50. The signal cable connector 38 and power connector 48 engage the fan tray connectors 26 and 36 by passing through cutouts 19 in the chassis 10 and fan tray 20. Therefore, in order to slidably remove the fan tray 20 from the chassis 10 along the flanges 40, both the signal cable 32 and the power connector 48 must be unplugged from their respective connectors 36 and 26. This assures that the fan tray 20 is not displaced without first unplugging the signal and power cables.

Figure 6:
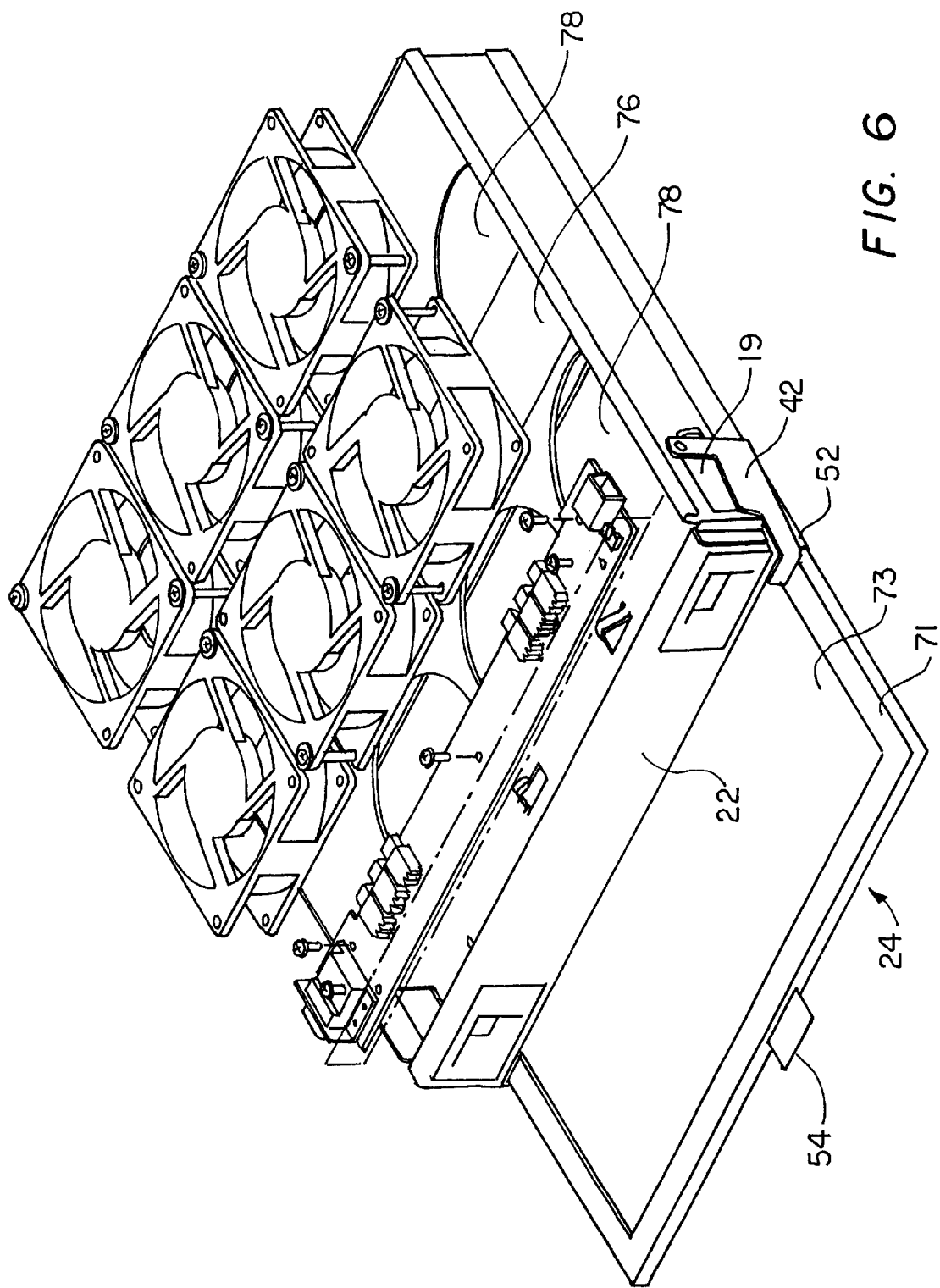
FIG. 6 is an exploded perspective view of the fan tray showing the filter interlock according to the present invention.
Figure 7A:
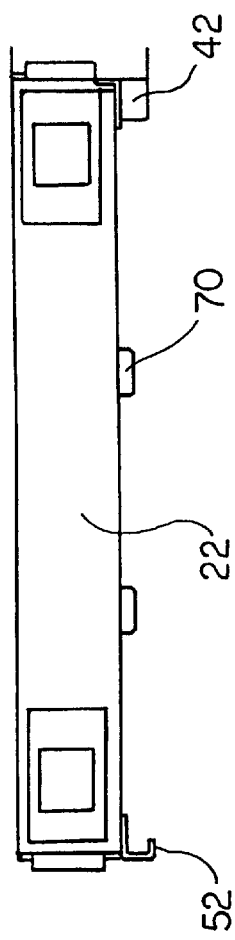
FIG. 7a is a plan view of the front of the fan tray according to the present invention.

Filter 24 fits under the fan tray 20 supported by flanges 52 (FIG. 7a). These flanges 52 support the filter 24 and assure that an installed filter 24 remains with the fan tray 20 even when the fan tray 20 is removed from the chassis 10. As seen in FIG. 6, filter 24 comprises mesh filter material 73 supported by a frame 71. Tab 54 facilitates installation and removal of filter 24. Filter interlock 42 retains the filter 24 on the flanges.

Figure 5A:
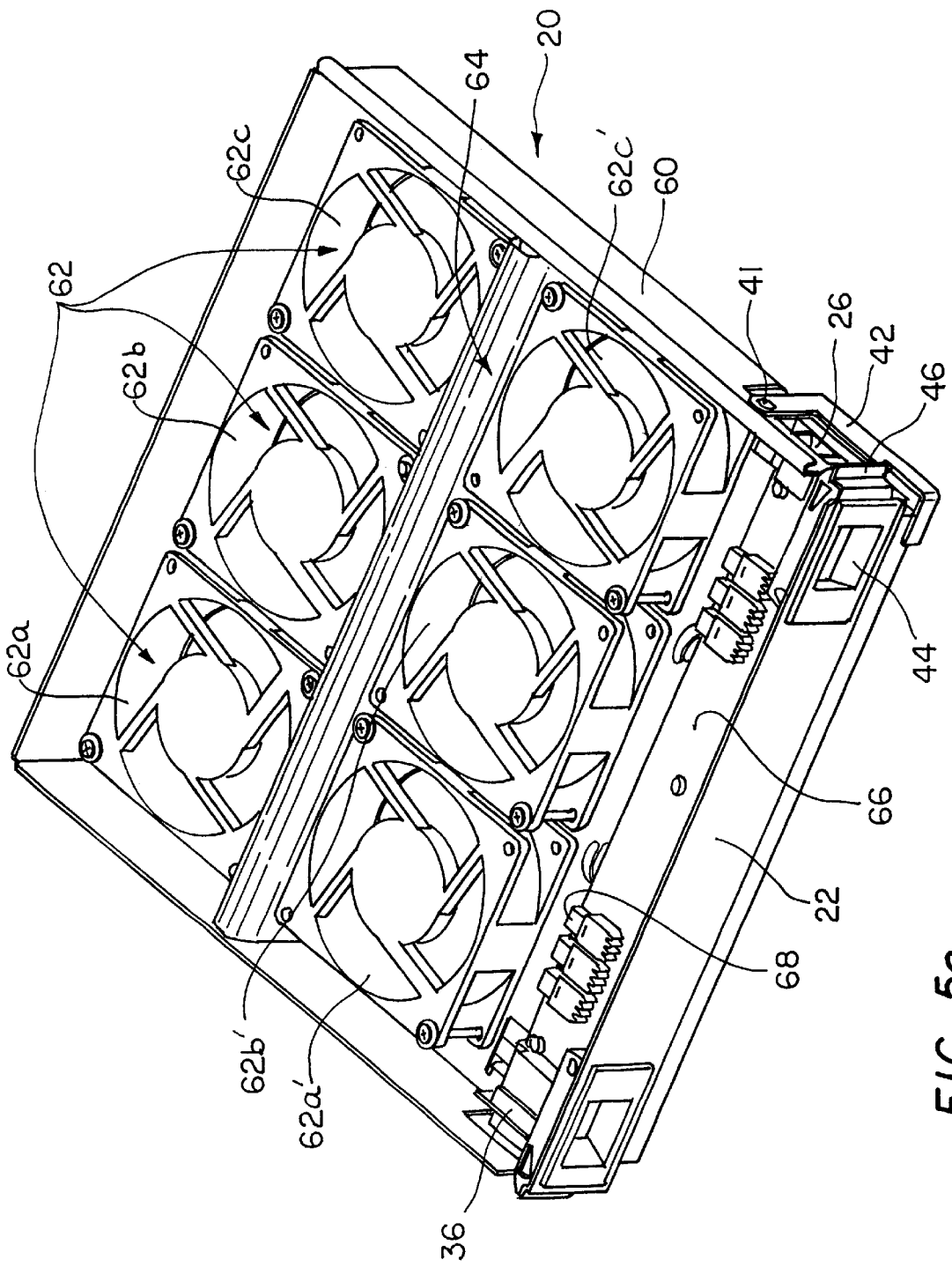
FIG. 5a is a perspective top view of the fan tray according to the present invention.

As illustrated in FIG. 5a, filter interlock 42 pivots about pin 41 and must be lifted before the filter 24 can be removed from beneath fan tray 20. If the fan tray 20 has been displaced from its home position on flanges 40 and power connector 48 has not been reinstalled in connector 26, the filter interlock 42 pivots freely. However as shown in FIG. 4, where the fan tray 20 is locked into home position and filter interlock is shown lifted slightly, the filter interlock 42 can only be pivoted when there is no cable plugged into power connector 26. Hence, filter 24 may be changed as long as power is not applied to the fan tray 20. The fan tray 20 operates with or without the filter 24 installed.

As illustrated in FIG. 5a, inside the fan tray 20 are disposed a power and signal distribution housing 66, an array of fans 62, (fans 62a', 62b' and 62c' in a front portion and fans 62a, 62b and 62c in a rear portion) cabling 68 between the power and signal distribution housing 66 and the fans 62 and an air dam 64 that impedes front-to-back flow of air. The power and signal distribution housing 66 receives power via connector 26 and distributes it to the individual fans 62. Logic (not shown) in the housing allows the power to each fan 62 ... 62c, 62a'... 62c' to be varied in response to command signals from the backplane. The power and signal distribution housing 66 further distributes fan status and command signals between the fans 62 and backplane.

In one aspect, the fans 62 are arrayed in two rows on planar fan support element of the fan tray 20. When a fan fails, air from neighboring fans has a tendency to leak out the aperture beneath the failed fan. Such leakage is stronger in the direction of orientation of the cards to be cooled than in the orthogonal direction (in this case, cards are mounted front-to-back) The air dam 64, by impeding front-to-back airflow, minimizes the leakage effect from a failed fan. If the volume of air moved by the functional fans is increased to compensate for a failed fan, the air dam further improves performance.

The air dam 64 extends the full height of the fan tray. When the depth of the fan tray 20 is greater than the depth of the fans, the space above the fans forms two plenums separated by the air dam. The plenums allow positive air pressure to build and laminar airflow to develop before the air enters the enclosure. The pressure and laminar airflow minimize any need for blank boards to direct airflow in the card cage.

Figure 5B:
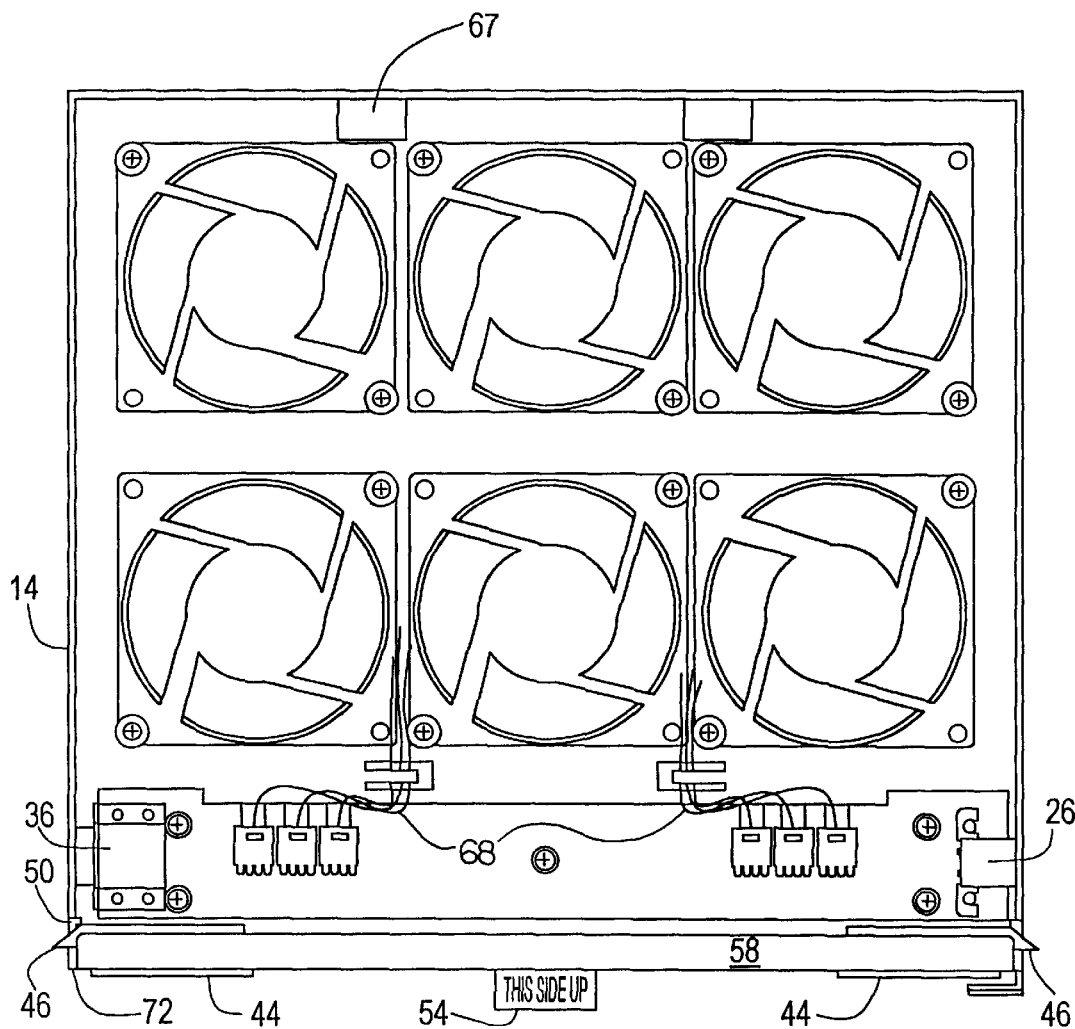
FIG. 5b is a top view of the fan tray according to the present invention.

The detail of the slam latch tongue 46, as shown in FIG. 5b, illustrates the operation of the slam latch. As the fan tray 20 is pushed back against the front edge 72 of the side wall 14, the wedge portion of the tongue 46 causes the tongue 46 to slide inward until it is compressed behind enclosure side wall 14. When the fan tray 20 seats into home position, as shown in FIG. 5b, the compressed tongue 46 is aligned with the cutout 50, and the tongue springs back, engaging the cutout 50 and preventing further movement of the fan tray 20. To disengage the slam latch 44, the front grip is slid inward, disengaging the tongue from the cutout.

Figure 7B:
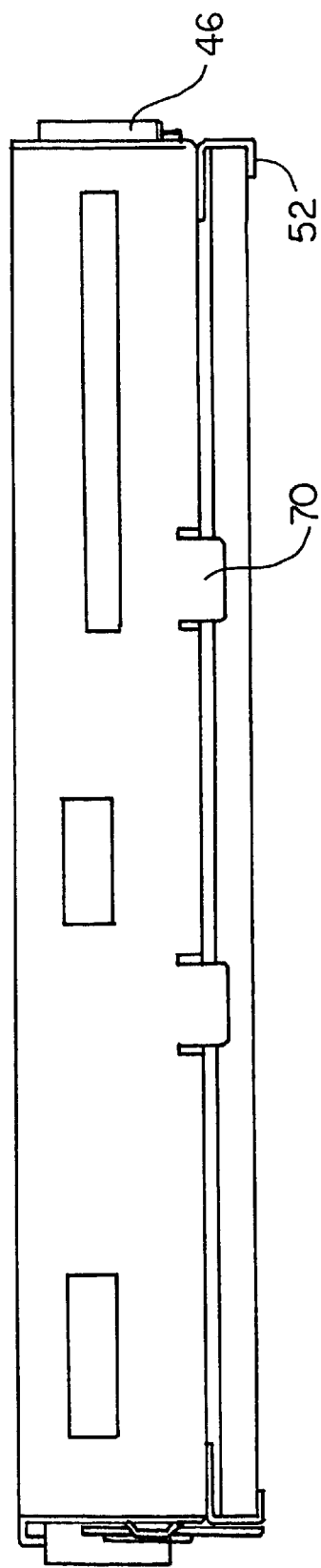
FIG. 7b is a plan view of the rear of the fan tray according to the present invention.

FIG. 6 shows an exploded view of the fan tray 20 showing each fan 62 mounted above an air intake aperture 78 in the planar fan support pan 76. The filter 24 is illustrated extended from the guide 52. Filter interlock 42 is upwardly displaced in order to allow the filter 24 to be extracted. Note that the displaced interlock 42 partially obscures the opening 19 preventing installation of the power cable in power connector 26. During installation, the filter slides on guides 52 until it contacts stops 70 as illustrated in FIGS. 7a and 7b. FIG. 7b, a front view of the fan tray 20 when a filter is not installed, shows the filter guides (flanges) 52 extending from the fan tray. The filter interlock is illustrated in the normal position blocking access to one flange 52. Stops 70 extend down from the fan tray. FIG. 7b, illustrates that in one aspect, stops 70 can be formed as part of the back of the tray.

Figure 8:
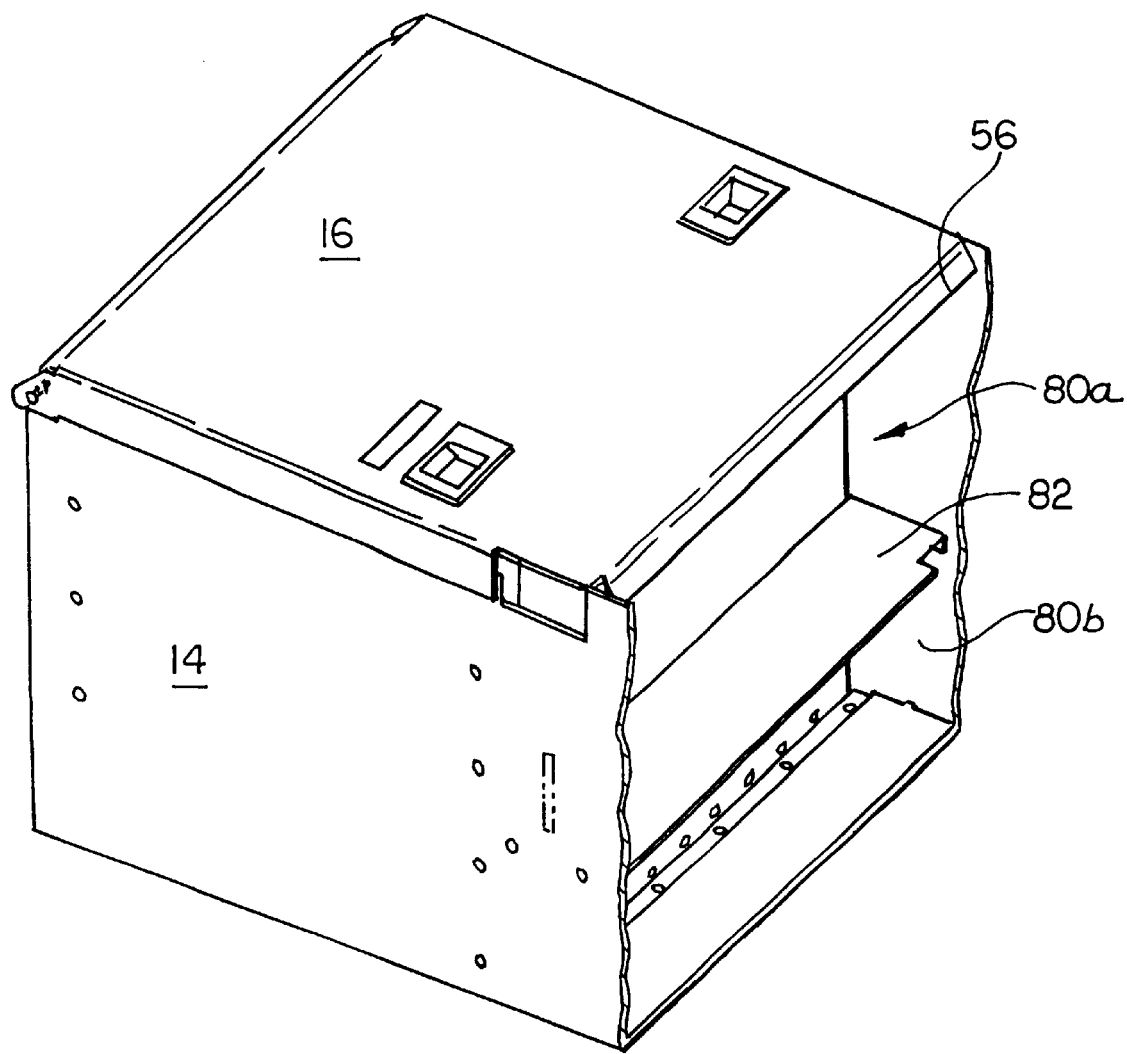
FIG. 8 is a bottom perspective view of an enclosure cutaway to show the baffle according to the present invention.

To improve the cooling action of the air pushed into the enclosure 10 by the fans 62, one embodiment incorporates a plenum 80 and baffle 82 system in the enclosure by extending the side panels 14, front cover 16, and mounting panel 12 to form a skirt as shown in FIG. 8. Baffle 82 divides plenum 80 into two plenums 80a and 80b. Baffle 82 is aligned with the air dam 64 of the fan tray 20 to extend the 2 separate fan tray plenums providing more volume to build the positive pressure assuring more uniform airflow to the card cage.

In the illustrated embodiment, the fan tray provides medium to low speed forced airflow. The greater number of low speed fans produces the same cooling result as one high-speed fan with significantly reduced noise. The fan tray can be used in or beneath electronic device enclosures or any electronic enclosure that requires cooling of the electronic components inside the enclosure.

Those of ordinary skill in the art should further appreciate that variations to and modifications of the above-described enclosure and fan assembly may be made without departing from the inventive concepts disclosed wherein. Accordingly, the present invention should be viewed as limited solely by the scope and spirit of the appended claims.

What is claimed is:

1. An apparatus for obstructing the removal of a fan tray from an electronic assembly, comprising:

a chassis including a generally planar side member having a passage therethrough, the passage being at least partially bounded by a portion of the side member;

a fan tray removably mounted to the chassis, the fan tray including a generally planar fan support member and at least one fan mounted to the fan support member, said at least one fan having power leads;

a connector having a first portion and a second portion, said power leads electrically coupled to said first portion of said connector, said first portion of said connector mounted to said fan tray and said second portion being electrically coupleable to a power service;

whereby, said second portion being connectable to said first portion in a position in which said second portion is disposed through said passage and the fan tray is obstructed from movement due to the portion of said side member in a predetermined direction preventing passage of said second portion of said connector from the chassis.

2. The apparatus of claim 1 wherein said connector is positioned so that said power connection is made through aligned passages in a side of said fan tray and said side of said chassis.

3. The apparatus of claim 1 further comprising:

a second passage through said generally planar side member of said chassis the second passage being at least partially bounded by a portion of the side member;

a signal connector having a first portion and a second portion, signal leads electrically coupled to said first portion of said connector, said first portion of said connector mounted to said fan tray and said second portion being electrically coupled to a signal cable;

whereby, said second portion of said signal connector being connectable to said first portion of said signal connector in a position in which said second portion of said signal connector is disposed through said second passage and the fan tray is obstructed from movement due to the portion of said side member in a predetermined direction preventing passage of said second portion of said signal connector from the chassis.

4. The apparatus of claim 3 wherein said signal connector is positioned so that connection is made through aligned passages in a side of said fan tray and said side of said chassis.

5. A fan tray mountable to a chassis, comprising:

a generally planar fan support member having at least one aperture for allowing passage of air therethrough;

at least one fan mounted to the fan support member such that the respective at least one fan is in registration with the at least one aperture, the at least one fan having power leads electrically connectable to a power connector;

a generally planar side member coupled to the fan support member;

a filter for filtering air passing through the at least one aperture, the filter being supported by a frame removably mounted to the fan support member; and a locking member pivotally mounted to the side member and pivotable between a first position and a second position, wherein the locking member obstructs removal of the filter frame from the frame support member when in the first position and the locking member does not obstruct the filter frame when in the second position, whereby, when the locking member is in the first position and the power connector is connected to the power leads of the at least one fan, the power connector obstructs the movement of the locking member so as to prevent movement of the locking member from the first position to the second position.

6. The fan tray of claim 5 further comprising flanges incorporated in a bottom of said chassis to support said filter.

7. The fan tray of claim 6 further comprising stops extending downward from said bottom, said stops limiting the depth of insertion of said filter frame.

8. A fan tray air baffle system for use with a chassis, comprising:

a skirt extending downward from said chassis partially enclosing a plenum;

a generally planar fan support member having a plurality of apertures for allowing passage of air therethrough and a set of four sidewalls surrounding said fan support member forming a fan tray;

at least two fans mounted to the fan support member, each fan being in registration with a respective one of the plurality of apertures;

at least one elongated barrier extending from said planar fan support member to a height parallel with a top of said sidewalls and being disposed in a mounting position between the at least two fans; and at least one baffle disposed across said plenum, said at least one baffle aligned with and abutting said at least one elongated barrier when said fan tray is in a home position, to divide said plenum into a pair of plenums;

wherein said pair of plenums are adapted to reduce the portion of a current of air produced by at least one fan on a first side of the barrier passing through at least one aperture in registration with at least one corresponding fan on a second side of the barrier when the at least one corresponding fan is not operative.

9. The fan tray air baffle system of claim 8 wherein said fans are shallower than said sidewalls of said fan tray and said at least one elongated barrier, and said sidewalls and at least one elongated barrier extend said pair of plenums.

10. An electronics enclosure and fan tray assembly adapted to have said fan tray cool electronics in a card cage portion of said electronics enclosure, said card cage enclosed by a backplane, sidewalls, and a card cage door, and said fan tray having a rectangular parallelepiped shape, said assembly comprising:

a set of flanges attached to a bottom of said sidewalls of said electronics enclosure;

at least one slam lock disposed on a front panel of said fan tray, a tongue of said at least one slam lock extending toward at least one side of said fan tray;

at least one opening in at least one sidewall aligned to receive said tongue, wherein said fan tray locks in a home position relative to said electronics enclosure;

a bottom of said fan tray with at least one aperture to allow entry of air; and at least one fan, each fan positioned over an aperture;

wherein said fan tray is adapted to slidably engage said set of flanges of said electronics enclosure.

11. The assembly of claim 10 further comprising:

a set of flanges attached to a bottom of sidewalls of said fan tray; and a filter slidably disposed on said flanges and sized to filter air into all apertures;

whereby slidably engaging said fan tray with said electronic enclosure flanges engages said filter with said enclosure.

* * * * *